United States Patent
Asao

(10) Patent No.: US 9,385,160 B2
(45) Date of Patent: Jul. 5, 2016

(54) SEMICONDUCTOR STORAGE DEVICE

(71) Applicant: KABUSHIKI KAISHA TOSHIBA, Minato-ku, Tokyo (JP)

(72) Inventor: Yoshiaki Asao, Kawasaki (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 14/945,287

(22) Filed: Nov. 18, 2015

(65) Prior Publication Data

US 2016/0071906 A1    Mar. 10, 2016

Related U.S. Application Data

(60) Continuation of application No. 14/717,288, filed on May 20, 2015, now Pat. No. 9,224,786, which is a division of application No. 14/517,132, filed on Oct. 17, 2014, now Pat. No. 9,064,792, which is a (Continued)

(30) Foreign Application Priority Data

May 9, 2011  (JP) .................................. 2011-104451

(51) Int. Cl.
*H01L 29/82* (2006.01)
*H01L 27/22* (2006.01)
(Continued)

(52) U.S. Cl.
CPC ............ *H01L 27/222* (2013.01); *G11C 11/161* (2013.01); *H01L 23/528* (2013.01); *H01L 43/02* (2013.01); *H01L 43/08* (2013.01); *H01L 43/10* (2013.01)

(58) Field of Classification Search
CPC ..... H01L 43/08; H01L 29/82; H01L 23/5226; H01L 23/528; H01L 27/222; H01L 43/065; G11C 11/16

USPC ............. 257/421–427, E29.323; 438/3; 360/324–326, 313; 365/157–158, 365/171–173

See application file for complete search history.

(56) References Cited

U.S. PATENT DOCUMENTS 4,725,876 A * 2/1988 Kishi .................. H01L 27/0802 257/541
6,368,878 B1  4/2002 Abraham et al.
(Continued)

FOREIGN PATENT DOCUMENTS

JP   2007-300079   11/2007
JP   2008-091703    4/2008
(Continued)

OTHER PUBLICATIONS

Hosomi, M. et al. A Novel Nonvolatile Memory with Spin Torque Transfer Magnetization Switching: Spin-RAM, IEDM Tech. Dig., 2005, pp. 473-476.

(Continued)

*Primary Examiner* — Jami M Valentine
(74) *Attorney, Agent, or Firm* — Knobbe, Martens, Olson & Bear LLP

(57) ABSTRACT

A memory includes a semiconductor substrate. Magnetic tunnel junction elements are provided above the semiconductor substrate. Each of the magnetic tunnel junction elements stores data by a change in a resistance state, and the data is rewritable by a current. Cell transistors are provided on the semiconductor substrate. Each of the cell transistors is in a conductive state when the current is applied to the corresponding magnetic tunnel junction element. Gate electrodes are included in the respective cell transistors. Each of the gate electrodes controls the conductive state of the corresponding cell transistor. In active areas, the cell transistors are provided, and the active areas extend in an extending direction of intersecting the gate electrodes at an angle of (90−atan(⅓)) degrees.

13 Claims, 10 Drawing Sheets

Related U.S. Application Data continuation of application No. 14/316,380, filed on Jun. 26, 2014, now abandoned, which is a continuation of application No. 13/970,421, filed on Aug. 19, 2013, now Pat. No. 8,791,535, which is a continuation of application No. 13/420,106, filed on Mar. 14, 2012, now Pat. No. 8,513,751.

(51) Int. Cl.
G11C 11/16 (2006.01)
H01L 43/02 (2006.01)
H01L 43/08 (2006.01)
H01L 23/528 (2006.01)
H01L 43/10 (2006.01)

(56) References Cited

U.S. PATENT DOCUMENTS

| | | | |
|---|---|---|---|
| 7,529,114 B2 | 5/2009 | Asao | |
| 7,745,894 B2 | 6/2010 | Asao et al. | |
| 8,513,751 B2 | 8/2013 | Asao | |
| 8,559,210 B2 | 10/2013 | Miyata et al. | |
| 8,629,423 B1 * | 1/2014 | Kislov | H01L 31/1085 250/214.1 |
| 2005/0243039 A1 * | 11/2005 | Kwak | G09G 3/3233 345/76 |
| 2007/0120128 A1 * | 5/2007 | Sato | G11C 11/5678 257/68 |
| 2007/0258281 A1 | 11/2007 | Ito et al. | |
| 2010/0081395 A1 | 4/2010 | Woo et al. | |
| 2012/0127778 A1 | 5/2012 | Miyata et al. | |
| 2014/0021520 A1 | 1/2014 | Asao | |
| 2015/0255506 A1 | 9/2015 | Asao | |

FOREIGN PATENT DOCUMENTS

| | | |
|---|---|---|
| JP | 2008-130995 | 6/2008 |
| JP | 2012-114118 | 6/2012 |

OTHER PUBLICATIONS

Park, Y.K. et al. "Fully Integrated 56nm DRAM Technology for 1 Gb DRAM" Symposium on VLSI Tech. p. 190-191 (2007).

Cho, C. et al. "A $6F^2$ DRAM Technology in 60nm era for Gigabit Densities" Symposium on VLSI Tech. p. 36-37 (2005).

Japanese Office Action for corresponding Japanese Application No. 2011-104451, mailed Oct. 3, 2014, in 4 pages.

* cited by examiner

SEMICONDUCTOR STORAGE DEVICE

CROSS REFERENCE TO RELATED APPLICATIONS

This application is a continuation of U.S. patent application Ser. No. 14/717,288, filed on May 20, 2015, which is a divisional of U.S. patent application Ser. No. 14/517,132, filed on Oct. 17, 2014, which is a continuation of U.S. patent application Ser. No. 14/316,380, filed on Jun. 26, 2014, which is a continuation of U.S. patent application Ser. No. 13/970, 421, filed on Aug. 19, 2013, which is a continuation of U.S. patent application Ser. No. 13/420,106, filed on Mar. 14, 2012, which is based upon and claims the benefit of priority from the prior Japanese Patent Application No. 2011-104451, filed on May 9, 2011; the entire contents of these applications are incorporated herein by reference.

FIELD

The embodiments of the present invention relate to a semiconductor storage device.

BACKGROUND

A magnetic random access memory (MRAM) is a type of a resistance change memory. As techniques for writing data to the MRAM, magnetic field writing and spin-transfer torque writing have been known. Among these techniques, the spin-transfer torque writing has advantages in higher integration, lower power consumption, and higher performance because of the property of a spin-transfer torque device that a smaller amount of a spin injection current is necessary for magnetization reversal as the size of magnetic bodies becomes smaller.

A spin-transfer torque MTJ (Magnetic Tunnel Junction) element has a stacked structure in which a nonmagnetic barrier layer (an insulating thin film) is sandwiched between two ferromagnetic layers, and stores data by a change in a magnetic resistance caused by spin-polarized tunneling. The MTJ element can be switched into a low resistance state or a high resistance state depending on the magnetization orientations of the two ferromagnetic layers. The MTJ element is in a low resistance state when the magnetization orientations (spin directions) of the two ferromagnetic layers are in a parallel state (a P state), and in a high resistance state when the magnetization orientations (spin directions) thereof are in an anti parallel state (an AP state).

It is desired to downscale the MRAM like a DRAM. If the MTJ elements are not arranged equidistantly, that is, if the MTJ elements are not arranged uniformly in a plan layout, variations in the shape and size of the MTJ element occur among memory cells. The variations in the shape and size of the MTJ element lead to a variation in a signal read from each memory cell. Furthermore, if the MTJ elements are not arranged uniformly, the MTJ elements are adjacent to one another at different distances. As a result, if the distances between the MTJ elements are to be reduced for downscaling purposes, it is disadvantageously difficult to process the MTJ elements.

DETAILED DESCRIPTION

A semiconductor storage device according to the present embodiment comprises a semiconductor substrate. A plurality of magnetic tunnel junction elements are provided above the semiconductor substrate. Each of the magnetic tunnel junction elements stores data by a change in a resistance state, and the data is rewritable by a current. A plurality of cell transistors are provided on the semiconductor substrate. Each of the cell transistors is in a conductive state when the current is applied to the corresponding magnetic tunnel junction element. A plurality of gate electrodes are included in the respective cell transistors. Each of the gate electrodes controls the conductive state of the corresponding cell transistor. In a plurality of active areas, the cell transistors are provided, and the active areas extend in an extending direction of intersecting the gate electrodes at an angle of $(90-\text{atan}(\frac{1}{3}))$ degrees.

Embodiments will now be explained with reference to the accompanying drawings.

First Embodiment

Figure 1:
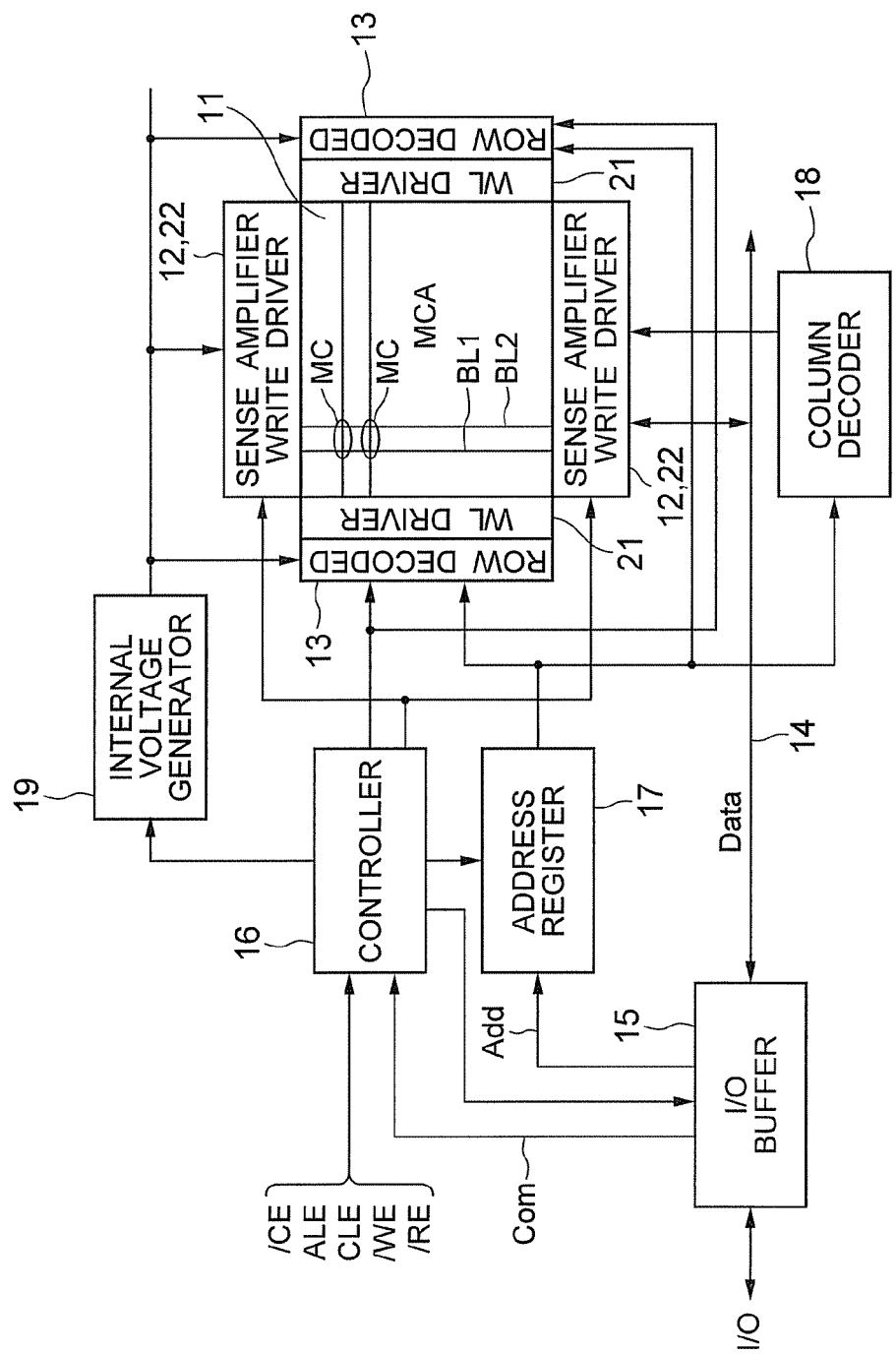
FIG. 1 is a block diagram showing a configuration of an MRAM according to a first embodiment.
Figure 2:
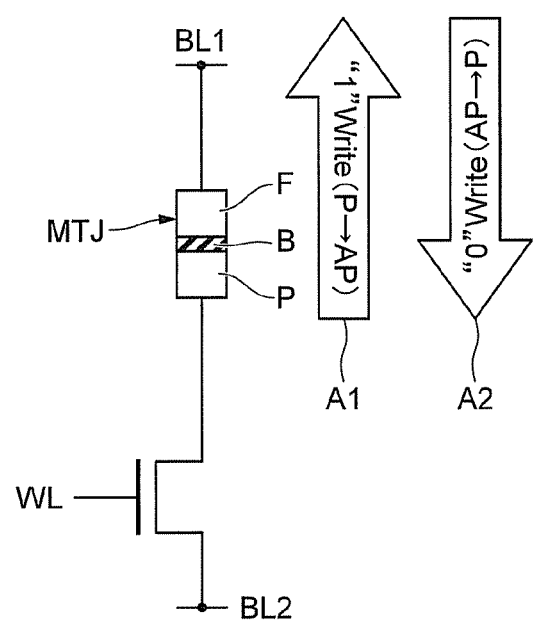
FIG. 2 is an explanatory diagram showing the data writing operation for writing data to one memory cell MC according to the first embodiment.

FIG. 1 is a block diagram showing a configuration of an MRAM according to a first embodiment. A plurality of memory cells MC are arranged two-dimensionally in a memory cell array 11. Each memory cell MC includes an MTJ element and a cell transistor CT, as shown in FIG. 2 to be described later. The MTJ element is a magnetic tunnel junction element that stores data by a change in a resistance state, and data stored in the MTJ element is rewritable by a current. The cell transistor CT is provided to correspond to one MTJ element and configured to set in a conductive state when a current is applied to the corresponding MTJ element.

A plurality of word lines WL are arranged in a row direction and a plurality of bit lines BL are arranged to in a column direction. The word lines WL and the bit lines BL are arranged to intersect one another. Two adjacent bit lines BL are paired, and the memory cells MC are provided to correspond to intersections between the word lines WL and paired bit lines (a first bit line BL1 and a second bit line BL2, for example), respectively. The MTJ element and the cell transistor CT of each memory cell MC are connected in series between the paired bit lines BL (BL1 and BL2, for example). A gate of the cell transistor CT is connected to one word line WL.

Sense amplifiers 12 and a write driver 22 are arranged on each side of the memory cell array 11 in the bit line direction, that is, the column direction. The sense amplifiers 12 are connected to the corresponding bit lines BL, respectively. Each of the sense amplifiers 12 senses a current flowing to the memory cell MC connected to a selected word line WL, thereby reading data stored in the memory cell MC. The write driver 22 is connected to the bit lines BL, and writes data to the memory cell MC connected to the selected word line WL by applying the current to the memory cell MC.

A row decoder 13 and a word line driver 21 are arranged on each side of the memory cell array 11 in the word line direction, that is, the row direction. The word line driver 21 is connected to the word lines WL and configured to apply a voltage to the selected word line WL during a data reading or data writing operation.

The sense amplifier 12 or write driver 22 transmits and receives data to and from an external input/output terminal I/O via a data bus 14 and an I/O buffer 15.

For example, various external control signals, a chip enable signal /CE, an address latch enable signal ALE, a command latch enable signal CLE, a write enable signal /WE, and a read enable signal /RE are input to a controller 16. The controller 16 identifies an address Add and a command Com supplied from the input/output terminal I/O on the basis of these control signals. The controller 16 transfers the address Add to the row decoder 13 and a column decoder 18 via an address register 17. In addition, the controller 16 decodes the command Com. Each sense amplifier 12 is configured to be able to apply a voltage to the corresponding bit line BL in response to a column address decoded by the column decoder 18. The word line driver 21 is configured to be able to apply a voltage to the selected word line WL in response to a row address decoded by the row decoder 13.

The controller 16 controls sequences of the data reading operation, the data writing operation, and a data erasing operation in response to the external control signals and commands. An internal voltage generator 19 is provided to generate internal voltages necessary for operations (such as a voltage stepped up from a power supply voltage). This internal voltage generator 19 performs a boosting operation and generates the necessary voltages under the control of the controller 16.

FIG. 2 is an explanatory diagram showing the data writing operation for writing data to one memory cell MC according to the first embodiment. The MTJ element of the memory cell MC according to the first embodiment is connected to the bit line BL2. The MTJ element that uses the TMR (tunneling magnetoresistive) effect has a stacked structure in which a nonmagnetic layer (a tunnel insulating film) B is sandwiched between two ferromagnetic layers F and P. The MTJ element stores digital data by the change in a magnetic resistance due to the spin-polarized tunneling. The MTJ element can be set in a low resistance state or a high resistance state depending on magnetization orientations of the two ferromagnetic layers F and P. For example, if it is defined that the low resistance state indicates data "0" and that the high resistance state indicates data "1", one-bit data can be recorded in the MTJ element. Alternatively, it can be defined that the low resistance state indicates data "1" and that the high resistance state indicates data "0".

For example, the MTJ element is configured to stack a pinned layer P, a tunnel barrier layer B, and a recording layer (a free layer) F from bottom up in this order. The pinned layer P and the free layer F are made of ferromagnetic bodies and the tunnel barrier layer B is an insulating film (made of $AL_2O_3$ or MgO, for example). The pinned layer P has a fixed magnetization orientation. The free layer F has a variable magnetization orientation. The MTJ element stores data depending on the magnetization orientation of the free layer F.

During the data writing operation, a current flows to the MTJ element in a direction of an arrow A1. In this case, the magnetization orientation of the free layer F is anti parallel (in the AP state) to that of the pinned layer P, whereby the MTJ element is in the high resistance state (data "1"). During the data writing operation, a current flows to the MTJ element in a direction of an arrow A2. In this case, the magnetization orientation of the free layer F is parallel (in the P state) to that of the pinned layer P, whereby the MTJ element is in the low resistance state (data "0"). In this way, different data can be written to the MTJ element depending on a current flow direction.

Figure 3:
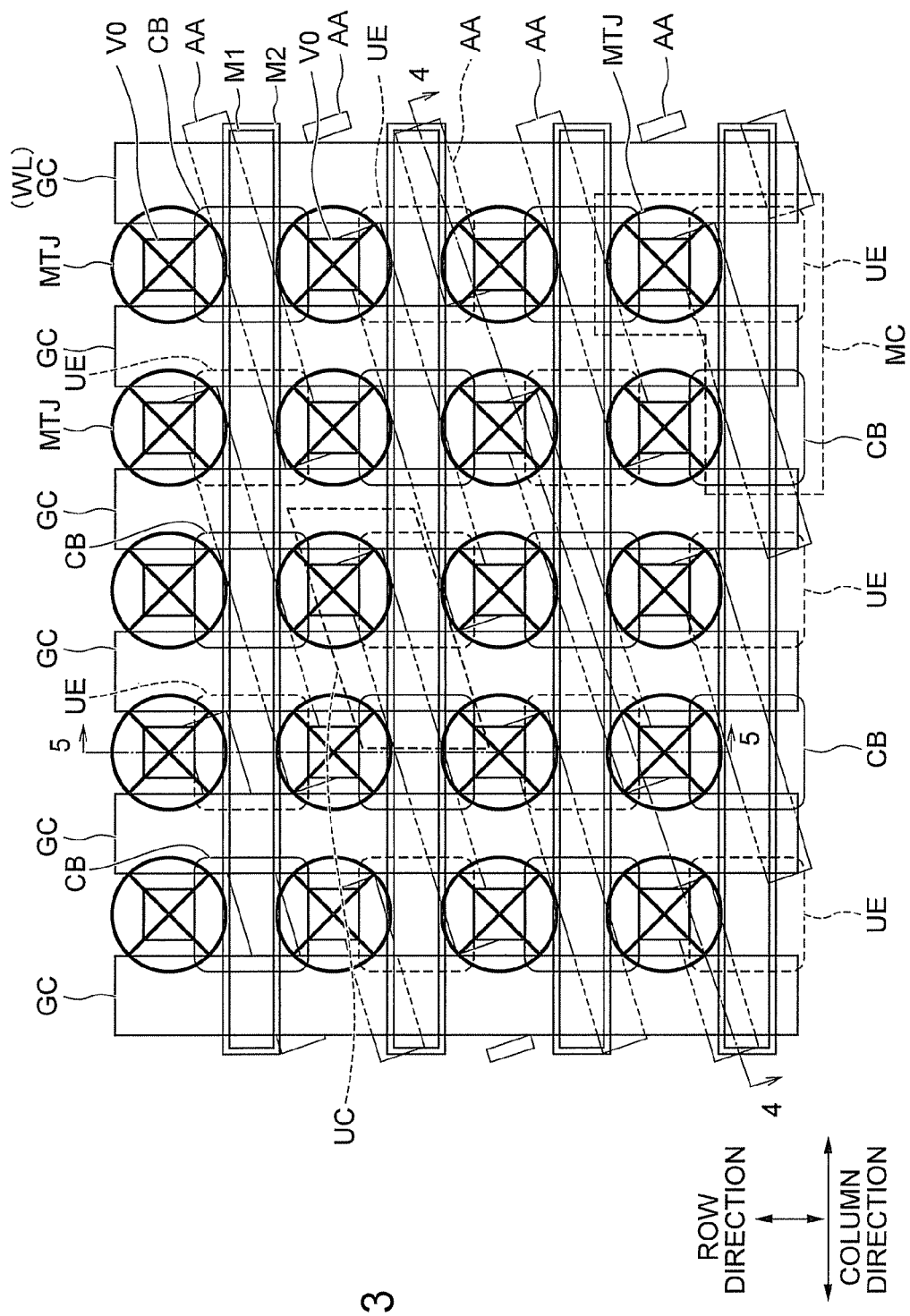
FIG. 3 is a plan layout view of the MRAM according to the first embodiment.
Figure 4:
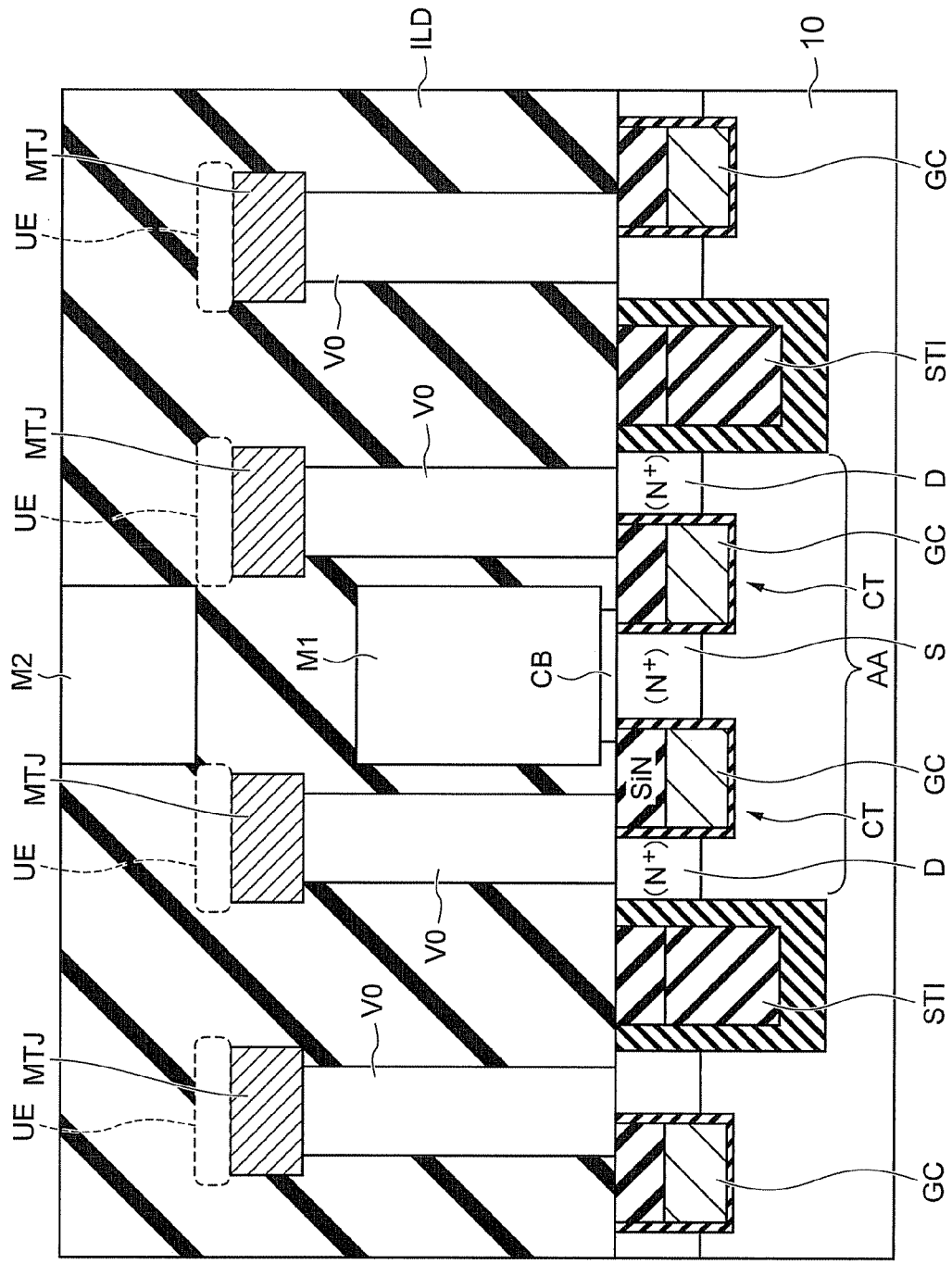
FIG. 4 is a cross-sectional view taken along a line 4-4 of FIG. 3.
Figure 5:
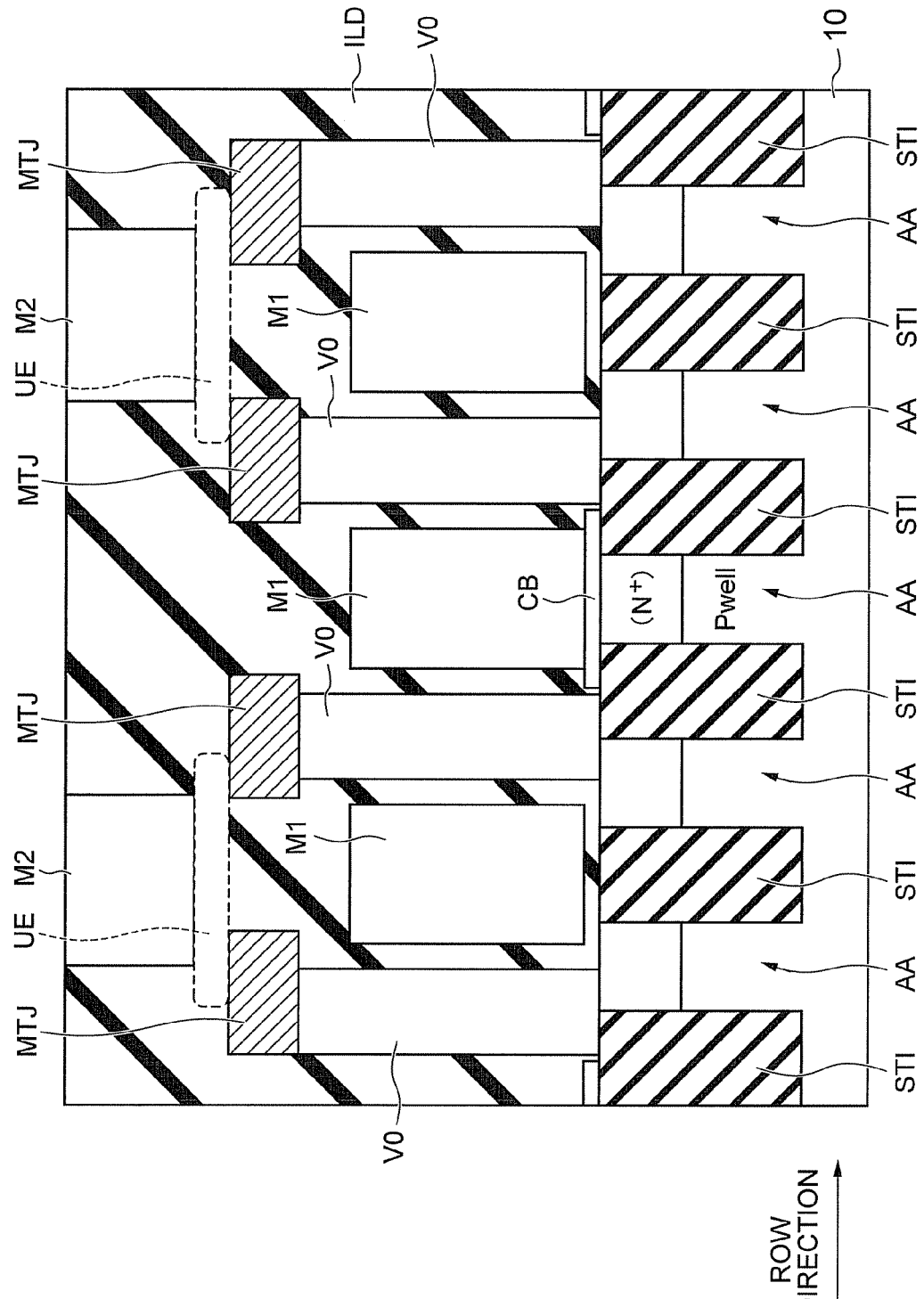
FIG. 5 is a cross-sectional view taken along a line 5-5 of FIG. 3.

FIG. 3 is a plan layout view of the MRAM according to the first embodiment. FIG. 4 is a cross-sectional view taken along a line 4-4 (an active area AA) of FIG. 3. FIG. 5 is a cross-sectional view taken along a line 5-5 (the row direction) of FIG. 3.

As shown in FIG. 3, it is assumed that an extending direction of gate electrodes GC is the row direction (first direction), and that a direction substantially orthogonal to the row direction is the column direction (second direction). The bit lines BL extend in the column direction.

As shown in FIGS. 4 and 5, the MRAM according to the first embodiment is formed on a semiconductor substrate 10. Active areas AA and element isolation regions STI (Shallow Trench Isolation) are alternately formed on the semiconductor substrate 10. The cell transistors CT are formed in the active areas AA. As shown in FIG. 4, each of the cell transistors CT includes the gate electrode GC buried in the semiconductor substrate 10, and also includes an N+ source diffusion layer S (hereinafter, also "source S") and an N+ drain diffusion layer D (hereinafter, also "drain D") on both sides of the gate electrode GC, respectively. The gate electrode GC is isolated from the semiconductor substrate 10 and first and second wirings M1 and M2.

The two cell transistors CT are formed in the same active area AA, and share the source S or drain D therebetween. It is assumed here that the two cell transistors CT share the source S.

The source S common to the two cell transistors CT is connected to the first wiring M1 that is formed out of a first metal wiring layer via a contact plug CB. The first wiring M1 is connected to the bit line BL2 (or a source line).

The drain D of each cell transistor CT is electrically connected to a lower end (for example, the pinned layer P) of one MTJ element via a via contact V0.

An upper end (for example, the free layer F) of the MTJ element is connected to an upper electrode UE. As shown in FIG. 5, the upper ends of the two MTJ elements adjacent in the row direction are connected to one common upper electrode UE, and the upper electrode UE is connected to the second wiring M2 that is formed out of a second metal wiring layer. The second wiring M2 is connected to the bit line BL1.

An ILD (Inter-Layer Dielectric) is an interlayer dielectric film for isolating the wirings from one another.

In FIG. 3, the cell transistors CT are provided at intersections between the gate electrodes GC and the active areas AA, respectively. The two cell transistors CT are provided for one active area AA. Each MTJ element is provided on one via contact V0 between the contact plug CB and the upper electrode UE in a plan layout. The two MTJ elements are formed to overlap with both ends of the active area AA, and connected to the common source S via the corresponding cell transistors CT, respectively. One MTJ element and one cell transistor CT constitute one memory cell MC. That is, the active areas AA are separated to correspond to pairs of cell transistors CT (pairs of the memory cells MC) in an extending direction of the active areas AA, respectively, and the two memory cells MC are provided in each active area AA.

As shown in FIG. 3, one memory cell MC is formed into a substantially L-shape. The size of a unit cell UC of the MRAM according to the first embodiment is as small as $6F^2$ ($3F\times2F$). Therefore, the MRAM according to the first embodiment can be used in place of the DRAM.

Furthermore, the MRAM can be used in place of an EEPROM because the MRAM is a nonvolatile memory. The symbol F indicates a minimum feature size when using lithography and etching.

In the data writing or data reading operation, the gate electrode GC (the word line WL) corresponding to one certain memory cell MC is driven so as to select the certain memory cell MC. A plurality of cell transistors CT connected to the selected word line WL and arranged in the row direction thereby become conductive. By applying a voltage difference to the paired bit lines BL1 and BL2 in one certain column, the memory cell MC corresponding to the intersections between the selected word line WL and the selected paired bit lines BL1 and BL2 can be selected, and a current can flow to the MTJ element of the selected memory cell MC via the cell transistor CT.

Figure 6:
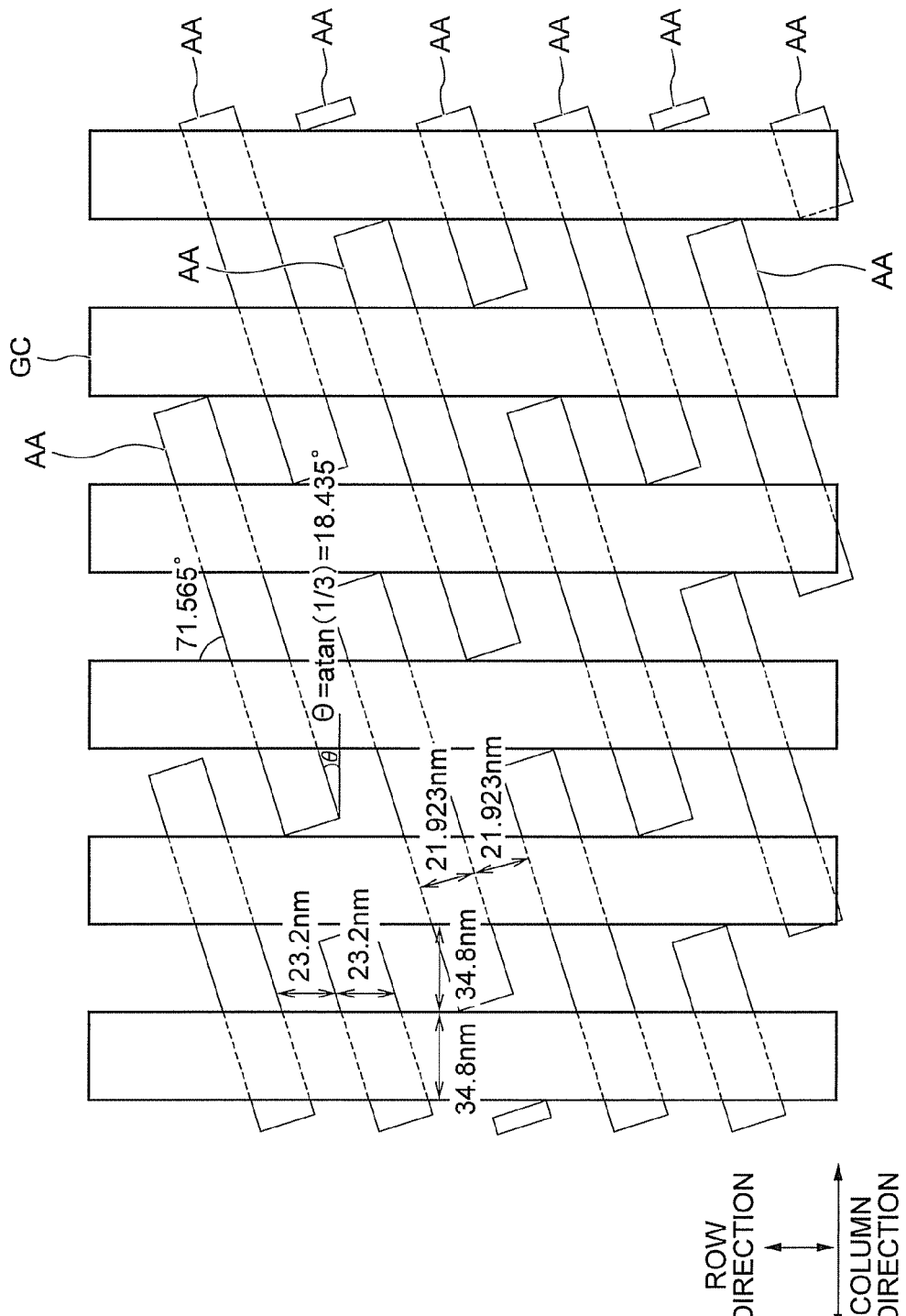
FIG. 6 is a plan view of the active areas AA and the gate electrodes GC according to the first embodiment.

FIG. 6 is a plan view of the active areas AA and the gate electrodes GC (the word lines WL) according to the first embodiment. The active areas AA according to the first embodiment extend in the direction of intersecting the gate electrodes GC at an angle of (90−atan(⅓)) degrees. That is, the active areas AA are inclined at an angle of about 71.565 degrees with respect to the row direction. To put it another way, the active areas AA are inclined at an angle of about 18.435 degrees with respect to the column direction.

Furthermore, in the first embodiment, a width of each gate electrode GC (the word line WL) or a distance between the two adjacent gate electrodes GC (the word lines WL) in the column direction is three-seconds or two-thirds of a width of each active area AA or a distance between the two adjacent active areas AA in the row direction.

The width of each gate electrode GC or the distance between the two adjacent gate electrodes GC in the column direction is about 34.8 nm, for example. The width of each active area AA or the distance between the two adjacent active areas AA is about 21.923 nm, for example. The active areas AA are inclined at the angle of atan(⅓) degrees (about 18.435 degrees) with respect to the column direction. Therefore, the width of each active area AA or the distance between the two adjacent active areas AA in the row direction is about 23.2 nm. Therefore, in this case, the width of each gate electrode GC or the distance between the two adjacent gate electrodes GC in the column direction is three-seconds of the width of each active area AA or the distance between the two adjacent active areas AA in the row direction.

Because the pitch of the bit lines BL is according to 1.5 times as large as that of the active areas AA, the ratio of the pitch of the bit lines BL (column) to that of the word lines WL (row) is 1:1.

On the other hand, the ratio of line and space of the active areas AA to those of the gate electrodes GC (the word lines WL) is 2:3.

In this way, the active areas AA are inclined at the angle of (90−atan(⅓)) degrees with respect to the row direction and the ratio of the pitch of the active areas A to that of the gate electrodes GC (the word lines WL) is set to 2:3. The MTJ elements can be thereby arranged equidistantly (at an equal pitch) in the row and column direction as shown in FIG. 3. In the specific example described above, the distance between the two adjacent MTJ elements in the row or column direction is about 69.6 nm.

In this way, the equidistant arrangement of the MTJ elements in the row and column directions in the plan layout can suppress the variations in the shape and size of the MTJ element (process variations) in an MRAM manufacturing process. The equidistant arrangement of the MTJ elements in the row and column directions can also facilitate processing the MTJ elements by the lithography and etching in the MRAM manufacturing process.

Furthermore, the MTJ elements are provided to correspond to all the intersections between a plurality of rows and a plurality of columns, respectively. Therefore, at the time of etching the MTJ elements, the MTJ elements can be processed using a plurality of sidewalls formed in the row and column directions as a mask. This enables the MTJ elements to be formed without using the lithography. As a result, the MRAM manufacturing process can be reduced. The sidewalls can be formed narrower than the minimum feature size F. Therefore, by using this sidewall mask processing technique, the MTJ elements can be further downscaled.

Second Embodiment

Figure 7:
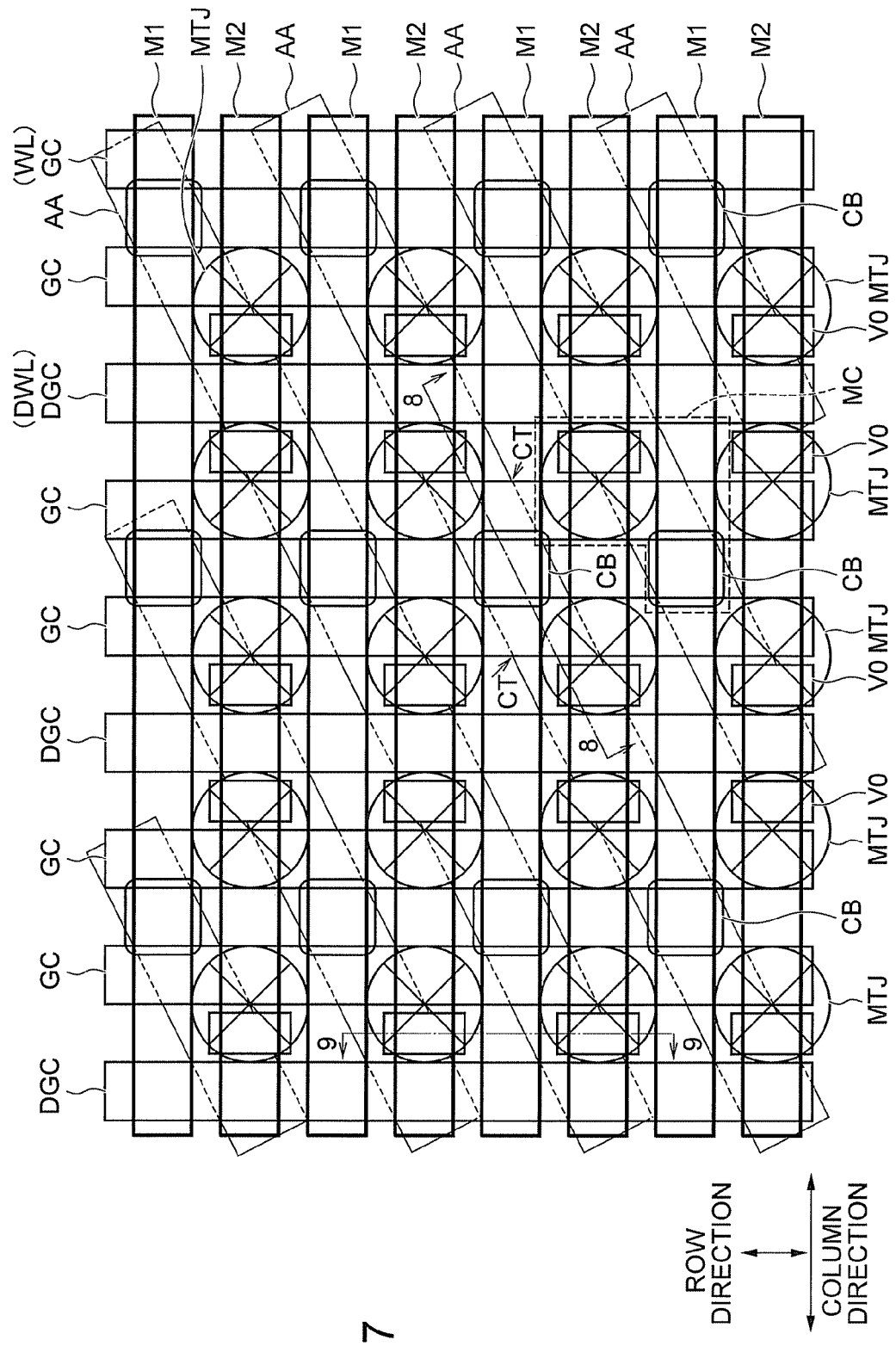
FIG. 7 is a plan layout view of an MRAM according to a second embodiment.
Figure 8:
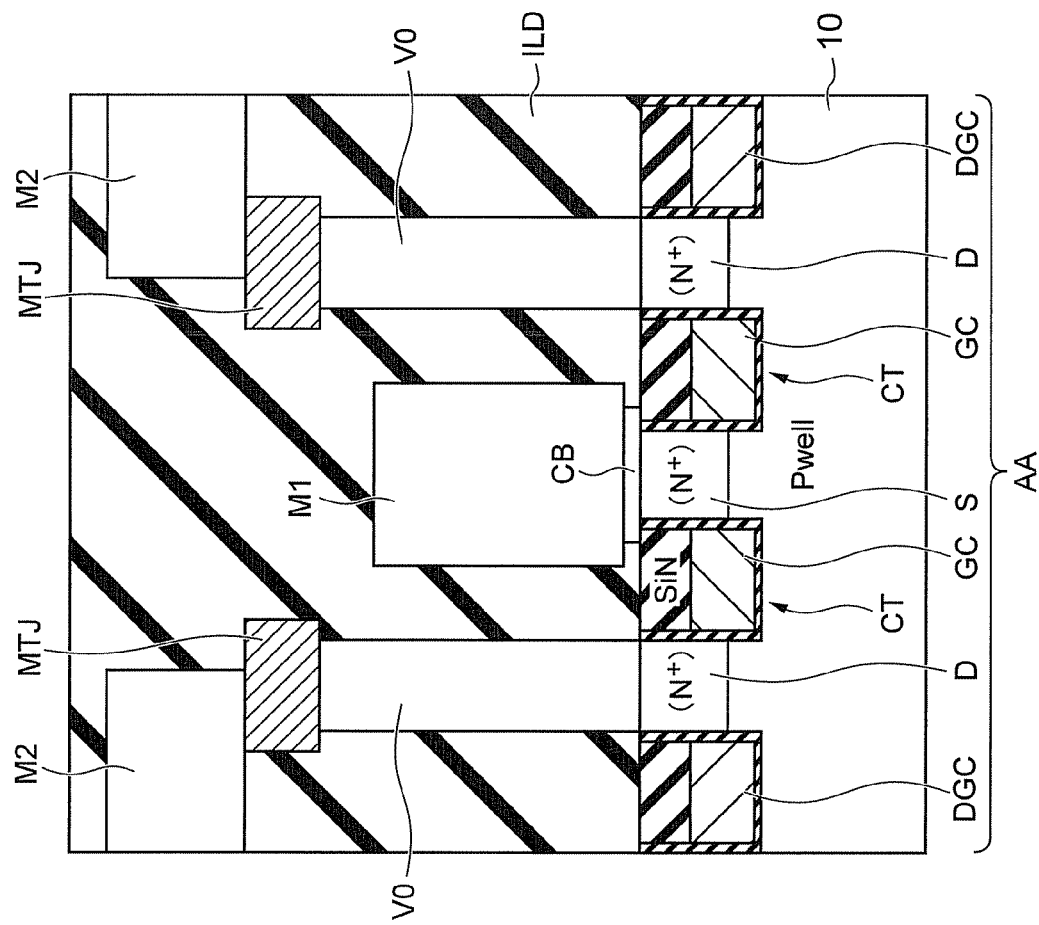
FIG. 8 is a cross-sectional view taken along a line 8-8 of FIG. 7.
Figure 9:
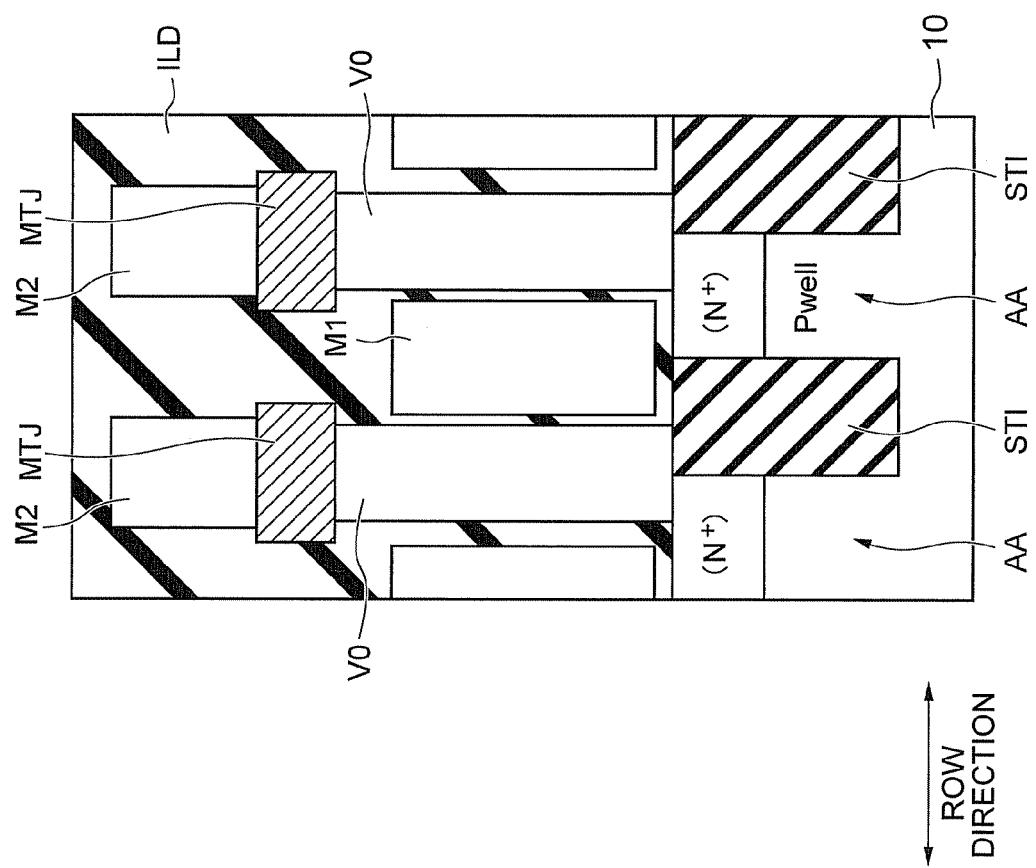
FIG. 9 is a cross-sectional view taken along a line 9-9 of FIG. 7.

FIG. 7 is a plan layout view of an MRAM according to a second embodiment. FIG. 8 is a cross-sectional view taken along a line 8-8 (the active area AA) of FIG. 7. FIG. 9 is a cross-sectional view taken along a line 9-9 (the row direction) of FIG. 7.

In the second embodiment, the active areas AA are not separated in the extending direction but extend continuously. The active areas AA extend in the direction of intersecting the row direction at an angle of (90−atan(½)) degrees (about 63.435 degrees). Furthermore, in the second embodiment, the width of each gate electrode GC (the word line WL) or the distance between the two adjacent gate electrodes GC (the word lines WL) is a half or twice as large as the width of each active area or the distance between the two adjacent active areas.

The second embodiment is explained in more detail.

As shown in FIGS. 8 and 9, the MRAM according to the second embodiment similarly to that according to the first embodiment is formed on the semiconductor substrate 10. The active areas AA and the element isolation regions STI are alternately formed on the semiconductor substrate 10. The cell transistors CT are formed in the active areas AA. As shown in FIG. 8, each of the cell transistors CT includes the gate electrode GC buried in the semiconductor substrate 10, and also includes the N+ source diffusion layer S and the N+ drain diffusion layer D on the both sides of the gate electrode GC, respectively. The gate electrode GC is isolated from the semiconductor substrate 10 and first and second wirings M1 and M2.

A plurality of cell transistors CT are continuously formed in the same active area AA. As shown in FIG. 8, a dummy gate electrode DGC is provided on one end of each of the two cell transistors CT sharing the source S or drain D, and the two cell transistors CT are substantially isolated from the other cell transistors CT. Therefore, in the second embodiment, the active areas AA are separated to correspond to pairs of cell transistors CT by the dummy gate electrodes DGC although continuing in the extending direction. Therefore, the two cell transistors CT sharing the source S shown in FIG. 8 function similarly to the two cell transistors CT shown in FIG. 4.

The source S common to the two cell transistors CT is connected to the first wiring M1 extending in the column direction via the contact plug CB. The first wiring M1 is connected to the bit line BL2 (or a source line).

The drain D of each cell transistor CT is electrically connected to the lower end (for example, the pinned layer P) of one MTJ element via the via contact V0.

The upper end (for example, the free layer F) of the MTJ element is connected to the second wiring M2. As shown in FIG. 7, one common second wiring M2 electrically connects the upper ends of a plurality of MTJ elements arranged in the column direction to one another. The second wiring M2 is connected to the bit line BL1.

As shown in FIG. 7, the first wirings M1 do not overlap with the second wirings M2 in the plan layout, and the first and second wirings M1 and M2 are provided alternately in the row direction and extend in the column direction.

Each of the first wirings M1 connects a plurality of contact plugs CB arranged in the column direction and connected to the respective sources S to the bit line BL2 (a source line). Each of the second wirings M2 connects the upper ends of the MTJ elements arranged in the column direction to the bit line BL1.

The MRAM according to the second embodiment does not include the upper electrodes UE. This can reduce the MRAM manufacturing process.

As shown in FIG. 9, each via contact V0 is electrically connected to the corresponding active area AA but deviates from the active area AA to be closer to the element isolation region STI. Similarly, each MTJ element deviates from the active area AA to conform to the via contact V0 in the plan layout. That is, each of the via contacts V0 and the MTJ elements has an offset with respect to the active area AA. This offset enables a plurality of MTJ elements to be arranged linearly in the column direction.

In FIG. 7, the cell transistors CT are provided at the intersections between the gate electrodes GC and the active areas AA, respectively. The two cell transistors CT are provided between the two adjacent dummy gate electrodes DGC in one active area AA. Each MTJ element is provided to overlap with the second wiring M2 and the via contact V0 in the plan layout. The two MTJ elements are connected to the common source S via the corresponding cell transistors CT. One MTJ element and one cell transistor constitute one memory cell MC. That is, the two memory cells MC are provided between the two adjacent dummy gate electrodes DGC in one active area AA. Therefore, as shown in FIG. 3, one memory cell MC is formed into a substantially L-shape. The size of the unit cell UC of the MRAM according to the second embodiment is as small as $6F^2$ ($3F \times 2F$). Therefore, the MRAM according to the second embodiment can be also used in place of the DRAM.

The data writing or data reading operation according to the second embodiment are identical to that according to the first embodiment and therefore explanations thereof will be omitted here.

Figure 10:
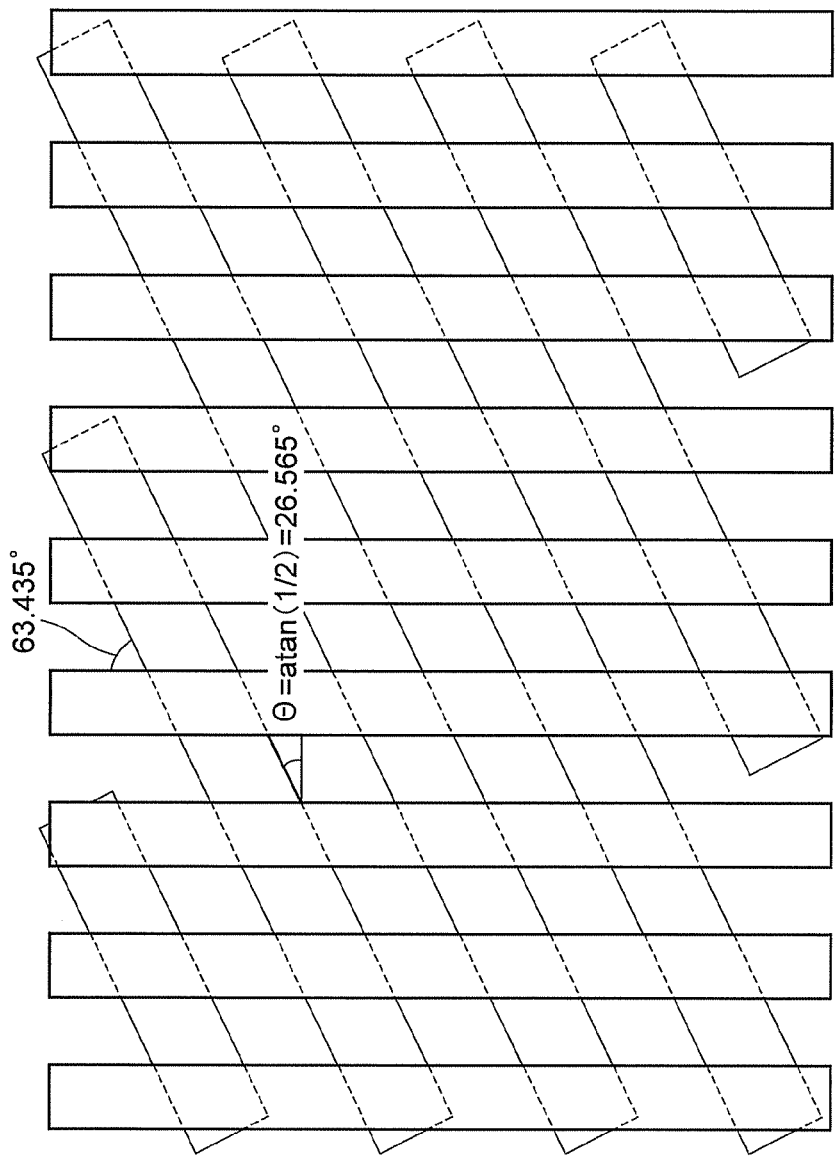
FIG. 10 is a plan view of the active areas AA and the gate electrodes GC according to the second embodiment.

FIG. 10 is a plan view of the active areas AA and the gate electrodes GC (the word lines WL) according to the second embodiment. The active areas AA according to the second embodiment extend in the direction of intersecting the gate electrodes GC at an angle of (90−atan(½)) degrees. That is, the active areas AA are inclined at an angle of about 63.435 degrees with respect to the row direction. To put it another way, the active areas AA are inclined at an angle of about 26.565 degrees with respect to the column direction. The active areas AA are continuous in the extending direction.

Furthermore, in the second embodiment, the width of each gate electrode GC (the word line WL) or the distance between the two adjacent gate electrodes GC (the word lines WL) in the column direction is twice or half as large as the width of each active area AA or the distance between the two adjacent active areas AA in the row direction.

The width of each gate electrode GC or the distance between the two adjacent gate electrodes GC in the column direction is about 23.2 nm, for example. The width of each active area AA or the distance between the two adjacent active areas AA is about 31.1 nm, for example. The active areas AA are inclined at the angle of atan(⅓) degrees (about 26.565 degrees) with respect to the column direction. Therefore, the width of each active area AA or the distance between the two adjacent active areas AA in the row direction is about 34.8 nm. Therefore, in this case, the width of each gate electrode GC or the distance between the two adjacent gate electrodes GC in the column direction is two-thirds of the width of each active area AA or the distance between the two adjacent active areas AA in the row direction.

Because the pitch of the bit lines BL is according that of the active areas AA, the ratio of the pitch of the bit lines BL (column) to that of the word lines WL (row) is 3:2. In other words, the ratio of line and space of the active areas AA (the bit lines BL) to those of the gate electrodes GC (the word lines WL) is 3:2.

In this way, the active areas AA are inclined at the angle of (90−atan(½)) degrees with respect to the row direction and the ratio of the pitch of the active areas A (the bit lines BL) to that of the gate electrodes GC (the word lines WL) is set to 3:2. The MTJ elements can be thereby arranged equidistantly (at an equal pitch) in the row and column direction as shown in FIG. 7. In the specific example described above, the distance between the two adjacent MTJ elements in the row or column direction is about 69.6 nm.

In this way, the MTJ elements can be arranged equidistantly in the row and column directions in the plan layout. Furthermore, in the second embodiment like the first embodiment, the MTJ elements are provided to correspond to all the intersections between a plurality of rows and a plurality of columns, respectively. Therefore, the second embodiment can also achieve effects identical to those of the first embodiment.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor storage device comprising:
a first word line and a second word line both extending in a first direction and being adjacent to each other in a second direction orthogonal to the first direction;
a third word line located adjacent to the second word line on the opposite side of the second word line with respect to the first word line, and extending in the first direction so as to be parallel with the second word line;
a fourth word line located adjacent to the third word line on the opposite side of the third word line with respect to the second word line, and extending in the first direction so as to be parallel with the third word line;
a first active area and a second active area both extending in a third direction that intersects with the word lines, the first and second active areas being isolated from each other by an element isolation area;

a first resistance change element connected to the first active area through a first via contact provided between the first and second word lines on the first active area;

a second resistance change element connected to the first active area through a second via contact provided between the third and fourth word lines on the first active area;

a third resistance change element connected to the second active area through a third via contact provided between the first and second word lines on the second active area; and a fourth resistance change element connected to the second active area through a fourth via contact provided between the third and fourth word lines on the second active area, wherein a total of a line width of one of the word lines and a space width between adjacent word lines has a ratio of about 3:2 to a length of a projected line obtained by projecting a center line on a line in the second direction, the center line being connected between centers of the first and fourth resistance change elements.

2. The device of claim 1, wherein a length of a line connected between centers of the first and fourth resistance change elements is approximately equal to a length of a line connected between centers of the first and third resistance change elements.

3. The device of claim 1, further comprising:
a first contact plug provided between the second and third word lines on the first active area; and
a first wiring extending in the second direction and electrically connected to the first contact plug.

4. The device of claim 1, further comprising a second wiring extending in the second direction and commonly connected to the first and fourth resistance change elements.

5. The device of claim 1, wherein the first and fourth word lines are dummy word lines.

6. The device of claim 1, wherein the resistance change elements contain a metal oxide material.

7. The device of claim 6, wherein the resistance change elements are MTJ elements.

8. A semiconductor storage device comprising:
a plurality of word lines extending in a first direction, the word lines including a dummy word line for each pair of active word lines adjacent to each other in a second direction substantially orthogonal to the first direction;
a plurality of active areas extending in a direction inclined to the first and second directions, the active areas being isolated from one another by element isolation areas;
a plurality of via contacts provided between each dummy word line and active word line on each active area; and
a plurality of resistance change elements electrically connected to the via contacts,
wherein a total of a line width of one of the word lines and a space width between adjacent word lines has a ratio of about 3:2 to a length of a projected line obtained by projecting a center line on a line in the second direction, the center line being connected between centers of two of the resistance change elements adjacent to each other in the second direction.

9. The device of claim 8, wherein a length of a line connected between centers of two of the resistance change elements adjacent to each other in the first direction is approximately equal to a length of a line connected between centers of two of the resistance change elements adjacent to each other in the second direction.

10. The device of claim 8, further comprising:
a contact plug provided between the active word lines on each active area; and
a first wiring extending in the second direction and electrically connected to the contact plug.

11. The device of claim 8, further comprising a second wiring extending in the second direction and commonly connected to the resistance change elements adjacent to each other in the second direction.

12. The device of claim 8, wherein the resistance change elements contain a metal oxide material.

13. The device of claim 12, wherein the resistance change elements are MTJ elements.

* * * * *